US006635099B2

United States Patent
LaSalle et al.

(10) Patent No.: US 6,635,099 B2
(45) Date of Patent: Oct. 21, 2003

(54) AQUEOUS NONFERROUS FEEDSTOCK MATERIAL FOR INJECTION MOLDING

(75) Inventors: Jerry C. LaSalle, Montclair, NJ (US); Mohammad Behi, Lake Hiawatha, NJ (US); George A. Glandz, Toms River, NJ (US); Joan V. Burlew, Rockaway, NJ (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 0 days.

(21) Appl. No.: 09/768,411

(22) Filed: Jan. 24, 2001

(65) Prior Publication Data

US 2002/0096016 A1 Jul. 25, 2002

(51) Int. Cl.$^7$ .................................................. B22F 3/12
(52) U.S. Cl. .............................. 75/247; 419/38; 419/37
(58) Field of Search ........................ 419/37, 38; 75/247

(56) References Cited

U.S. PATENT DOCUMENTS

| | | | | |
|---|---|---|---|---|
| 4,734,237 A | | 3/1988 | Fanelli et al. .................. 35/64 |
| 5,286,767 A | | 2/1994 | Rohrbach et al. .............. 524/27 |
| 5,523,049 A | * | 6/1996 | Terpstra et al. ................ 419/36 |
| 5,746,957 A | | 5/1998 | Fanelli et al. ................ 264/109 |
| 5,798,469 A | * | 8/1998 | Nufer ........................... 75/246 |
| 5,950,063 A | | 9/1999 | Hens et al. ..................... 419/5 |
| 5,963,795 A | * | 10/1999 | Schneider et al. ........... 438/122 |
| 6,261,336 B1 | * | 7/2001 | Behi et al. ..................... 75/246 |
| 6,262,150 B1 | * | 7/2001 | Behi et al. ..................... 524/27 |

* cited by examiner

*Primary Examiner*—Daniel J. Jenkins
(74) *Attorney, Agent, or Firm*—Ernest D. Buff & Associates, LLC; Ernest D. Buff; Gordon E. Fish

(57) ABSTRACT

This invention provides a process for forming sintered, molded articles having improved dimensional stability. More particularly, this invention pertains to process for forming heat sinks. This process includes forming a substantially uniform copper composition comprising a polysaccharide binder, water, and copper particles; molding the copper composition under conditions sufficient to form a solid molded intermediate; and sintering the solid molded intermediate at a sufficient temperature and for a sufficient time to form a heat sink.

20 Claims, No Drawings

AQUEOUS NONFERROUS FEEDSTOCK MATERIAL FOR INJECTION MOLDING

BACKGROUND OF THE INVENTION

1. Field of Invention

The present invention relates to the manufacture of heat sinks. More particularly, the invention relates to a process for forming molded, sintered heat sink articles from a composition comprising copper particles.

2. Description of the Related Art

Heat dissipation is essential in the field electronics and semiconductor components. These devices produce heat during operation and are typically housed within a substantially closed compartment. The high number of heat generating parts, coupled with their close proximity increases the need for proper cooling methods.

The ability to control and dissipate heat can be accomplished by the use of heat sinks. Heat sinks are generally known in the art. One known heat sink method includes a conductive metal structure having fins, which is thermally coupled to an electronic component to aid in reducing the temperature of the component. Another approach includes the use of a fan for blowing air over the electronic component. Another heat sink approach is described in U.S. Pat. No. 5,312,508 which discloses attaching a crimped wire mesh having a plurality of wire bends to an object requiring heat transfer.

Unfortunately, these known heat sinks and heat sink methods are expensive, unreliable, occupy too much space, and have limited effectiveness. It would therefore be desirable to formulate a heat sink which is efficient and inexpensive, while still being adaptable to a variety of heat dissipation requirements.

The present invention provides a solution to this problem. The invention provides a process for forming a heat sink which includes injection molding and sintering of a copper composition. Metal injection molding is a well known process for forming molded articles from metal particles. For example, see U.S. Pat. No. 5,746,957 which teaches a process for forming ceramic and/or metal articles from a composition comprising a ceramic and/or metal powder, a polysaccharide binder and a gel strength enhancing agent. The metal injection molding process generally involves injecting a moldable fluid composition into a mold of predetermined shape under conditions to form a shaped article, referred to as a "green body". After forming a green body, an article may be densified by sintering, so that it may have useful strength and other physical and mechanical properties. According to the invention, a substantially uniform copper composition comprising at least one polysaccharide binder, water, and copper particles is formed, and is then molded under conditions sufficient to form a solid molded intermediate. The solid molded intermediate is then sintered at a sufficient temperature and for a sufficient time to form a heat sink. These heat sinks may be formed into a variety of shapes, and can be used in various electronic and thermo-mechanical applications.

SUMMARY OF THE INVENTION

The invention provides a process for forming a heat sink which comprises:

a) forming a substantially uniform copper composition comprising:
  i) at least one gel forming polysaccharide binder;
  ii) water; and
  iii) copper particles having an average particle size in the range of from about 2 $\mu$m to about 40 $\mu$m;
b) molding the copper composition under conditions sufficient to form a solid molded intermediate; and
c) sintering the solid molded intermediate at a sufficient temperature and for a sufficient time to form a heat sink.

The invention also provides a process for forming a heat sink which comprises:

a) forming a fluid composition comprising:
  i) at least one gel forming polysaccharide binder; and
  ii) water;
b) heating the fluid composition to melt the binder;
c) blending copper particles into the fluid composition to thereby form a substantially uniform copper composition;
d) cooling the copper composition to thereby form a substantially solid copper composition;
e) shredding the substantially solid copper composition to form a feedstock;
f) optionally adjusting the moisture content in the feedstock to a level of from about 6% to about 8% moisture by weight of the feedstock;
g) molding the feedstock under conditions sufficient to form a solid molded intermediate; and
h) sintering the solid molded intermediate at a sufficient temperature and time to form a heat sink.

DETAILED DESCRIPTION OF THE PREFERRED EMBODIMENT

The invention provides a process for forming a heat sink. The first step in forming the heat sink of the invention is to form a substantially uniform copper composition comprising at least one gel forming polysaccharide binder; water; and copper particles, preferably having an average particle size in the range of from about 2 $\mu$m to about 40 $\mu$m.

The gel forming polysaccharide binder is first combined with the water to form a fluid composition. The gel forming binder is used primarily to achieve good flowability, good green strength of the molded component, and a high solids loading potential. The polysaccharide binder preferably comprises an agaroid. For the purposes of this invention, an agaroid refers to agar and any gums resembling agar, and derivatives thereof such as agarose. An agaroid is employed because it exhibits rapid gelation within a narrow temperature range, a factor which can increase the rate of production of articles. Additionally, the use of such gel-forming binders reduces the amount of binder needed to form a self-supporting heat sink article. Therefore, heat sinks produced using gel forming binders comprising agaroids can significantly enhance the quality of and stability of green bodies and sintered heat sink articles.

The preferred agaroids are those which are water soluble and comprise agar, agarose, carrageenan, and the like and combinations thereof, and most preferably comprise agar, agarose, and mixtures thereof. The gel forming binder preferably is present in an amount ranging from about 1.5% to about 10% by weight of the composition, more preferably from about 2% by weight to about 8% by weight of the copper composition, and most preferably from about 3% by weight to about 7% by weight of the copper composition.

The composition then contains water, preferably deionized water. The water is added in an amount sufficient to dissolve the gel forming binder and is preferably present in an amount sufficient to form a uniform mixture of the composition components. The composition may include an additional optional solvent such as an alcohol to aid blending of the composition components. The water is preferably present in an amount of from about 5% by weight to about 11% by weight of the copper composition, more preferably from about 7% by weight to about 11% by weight of the copper composition, and most preferably from about 8% by weight to about 10% by weight of the copper composition.

It is preferred that the fluid composition comprising the binder and the water is first heated to melt the binder. Copper particles are then blended into the fluid composition to thus form a substantially uniform copper composition. The characteristics of the copper powder chosen is important because the selection can influence and control the flowability, evaporation-condensation, lattice, grain boundary surface diffusion and sintering mechanisms of the moldable composition. The size distribution of the particles in the copper powder can also influence the solids loading and moldability of the composition. The shape of the particles is important for flow behavior and shape retention during thermal processing. Preferably the particles are substantially spherical. The powder preferably has an average particle size of from about 1 to about 200 µm and more preferably from about 1 to about 35 µm for powders. Should a combination of copper powders be used, then they are preferably blended to ensure that each powder is uniformly dispersed within the composition. This allows the additive and binder to perform their functions most effectively and ensures that maximum solids loading is obtained. The copper particles are preferably present in an amount of from about 50% by weight to about 97% by weight of the copper composition, more preferably from about 65% by weight to about 90% by weight of the copper composition, and most preferably from about 75% by weight to about 91% by weight of the copper composition.

The copper composition may also optionally comprise other additives. The additives are used, in part, to ensure that the binder effectively coats or attaches to the powder particles. Some powders may be incompatible with the binder and, therefore, need to be coated with an additive prior to introduction of the binder. Examples of such additives nonexclusively include sugar, gel strengthening agents, acids, bases, biocides, sodium silicate, borate additives, coupling agents, antioxidants, lubricants, dispersants, elasticizing agents, plasticizers, compatibilizers, wetting agent or surfactant and combinations thereof. Wetting agents include polyethylene glycol alkylether. Lubricants include zinc stearate, aluminum stearate and magnesium stearate.

Suitable sugars nonexclusively include glucose, sucrose, dextrose, fructose, and mixtures thereof. If present, the sugar is preferably present in an amount of from about 0.5% to about 6% by weight of the copper composition, more preferably from about 1% by weight to about 5% by weight of the copper composition, and most preferably from about 2% by weight to about 4% by weight of the copper composition. The weight ratio of the binder to the sugar preferably ranges from about 0.2 to about 3.5, more preferably from about 0.5 to about 3.0, and most preferably from about 1 to about 2.5.

Suitable gel strengthening agents nonexclusively include borates, and mixtures thereof. Suitable borate additives may comprise a water soluble compound selected from the group consisting of borate compounds of ammonium, aluminum, barium, bismuth, cadmium, calcium, cerium, cesium, chromium, cobalt, copper, dysprosium, erbium, europium, gadolinium, germanium, iron, lanthanum, lead, lithium, lutetium, magnesium, manganese, mercury, neodymium, nickel, potassium, rubidium, silver, strontium, tetraethylammonium, tetramethylammonium, thallium, thorium, titanium, vanadium, ytterbium, yttrium, zinc and hydrates and hydroxides thereof. If present, the gel strengthening agent is preferably present in an amount of from about 0.5% to about 6% by weight of the copper composition, more preferably from about 1% by weight to about 5% by weight of the copper composition, and most preferably from about 2% by weight to about 4% by weight of the copper composition.

The copper composition may also optionally comprise an acid, a base, or a combination thereof. The acid and base are added in an amount sufficient to adjust the pH of the composition to facilitate dispersion of the powder particles and increase the solids loading of the composition. The acids may be inorganic or organic, or mixtures thereof. Representative inorganic acids include hydrochloric acid, sulfuric acid, nitric acid, boric acid, phosphoric acid, carbonic acid and combinations thereof. Representative organic acids include acetic acid, formic acid, uric acid, lactic acid, benzoic acid and citric acid and combinations thereof. Preferred are the inorganic acids, namely hydrochloric acid, sulfuric acid, nitric acid, boric acid and combinations thereof.

The bases for this invention may be organic, inorganic or mixtures thereof. Inorganic bases, which are preferred, nonexclusively include calcium hydroxide, sodium hydroxide, potassium hydroxide, sodium silicate, calcium borate, potassium borate, magnesium borate and combinations thereof. Among these, sodium hydroxide, sodium silicate, calcium borate, potassium borate and combinations thereof are preferred. Organic bases include ammonium hydroxide. In the most preferred embodiment, the acid is nitric acid and the base is calcium borate.

The quantity of acid and base required to adjust the pH to a desired level is determined based on the initial pH of the chosen powder in deionized water. Preferably, the pH of the unsintered composition is from about 4.25 to about 9.5, more preferably from about 4.5 to about 7. The acid is preferably present in an amount of from about 0.01 to about 0.15 weight percent based on the water content of the composition, more preferably from about 0.01 to about 0.1 weight percent and most preferably from about 0.01 to about 0.15 weight percent. The base is preferably present in an amount of from about 0.01 to about 0.15 weight percent based on the water content of the composition, more preferably from about 0.01 to about 0.1 weight percent and most preferably from about 0.01 to about 0.15 weight percent.

Suitable biocides nonexclusively include methyl-p-hydroxybenzoate and propyl-p-hydroxybenzoate. If present, the biocide is present in an amount of from about 0.3% to 0.9% by weight of the binder composition, more preferably from about 0.5% by weight to about 0.8% by weight of the copper composition, and most preferably from about 0.5% by weight to about 0.7% by weight of the copper composition.

To form the moldable composition, the components are mixed such that a homogeneous composition is formed. The composition components may be blended in a heated mixer by generally well known techniques. Suitable mixing equipment includes a tumbler with an agglomerate breaker, a ribbon mixer, a vertical screw mixer, a single or twin rotor mixer, and a turbine mixer. Also appropriate for this invention is a screw extruder. Screw extruders are frequently used for fluid processing and comprise a continuous rotating screw or screws in a closely fitting barrel. In practice, materials are fed into the extruder as a dry solids, then are heated and mixed within the barrel to form the fluid composition, and discharged at open end.

Once the composition is mixed, the copper composition is cooled to form a substantially solid copper composition. This substantially solid copper composition is preferably shredded to form a feedstock. The moisture content of the feedstock may then optionally be adjusted to a level of from about 6% to about 6.5% moisture by weight of the feedstock.

The copper composition, or feedstock if formed, is then molded under conditions sufficient to form a solid molded intermediate. Shape and size of the solid molded intermediate may vary from one application to the next, and will be readily apparent to one skilled in the art. Molding may be done by any suitable molding method known in the art which would result in the formation of a solid molded heat sink. Various molding processes are well known in the art, including injection molding, hot-rolling, hot-pressing, flat pressing, blow molding, extruding and slip casting. For the fabrication of complex shapes such as cylinders, injection molding and extrusion are especially preferred. In order to help avoid the formation of a porous structure, vacuum may be applied during the forming step for shaped articles. If a hot-pressing method is used, the stress used for compacting is preferably as high as can be conveniently applied without fracturing the particles. For the purposes of this invention, molding is preferably conducted in an injection molding device. The composition is injected into a mold of a predetermined shape and size while in a fluid state with heat and under conditions sufficient to conform to the shape of the mold. The appropriate mold temperature can be achieved before, during or after the mixture is supplied to the mold. The preferred temperature for melt processing is at least about 5° C. above the melting point of the binder. More preferably, the temperature for melt processing is at least about 30° C. above the melting point of the binder. Molding is preferably conducted at a temperature ranging from about 70° C. to about 97° C. More preferably, the composition is molded at a temperature ranging from about 80° C. to about 95° C.

A wide range of molding pressures may be employed. Generally, the molding pressure is at least about 100 psi (7.0 kg/cm$^2$), preferably from about 100 psi (7.0 kg/cm$^2$) to about 50,000 (3515 kg/cm$^2$) although higher or lower pressures may be employed depending upon the molding technique used. More preferably molding pressures range from about 100 psi (7.0 kg/cm$^2$), to about 2000 psi (140.6 kg/cm$^2$), and most preferably, are from about 150 psi (10.5 kg/cm$^2$) to about 800 psi (56.2 kg/cm$^2$). Alternately, the composition may be extruded into pellet or particle form and stored for future molding.

After the heat sink is molded, it is cooled to a temperature below the gel point of the gel-forming material. For the purposes of this invention, this temperature ranges from about 10° C. to about 40° C. More preferably, this temperature ranges from about 15° C. to about 30° C. Following this step, the green body is removed from the mold. The green body may be subsequently dried and placed into a furnace for sintering at high temperatures.

The solid molded intermediate is then sintered at a sufficient temperature and for a sufficient time to form a heat sink. The sintering times and temperatures are regulated according to the powdered material employed to form the fluid composition. In general, the sintering temperatures are selected depending on the individual copper powders used. Sintering conditions for various materials are easily determinable by those skilled in the art. For the purposes of this invention, the molded article is preferably sintered at a near the solidus temperature of the material. The temperature is dependent on the materials selected. Preferred sintering temperatures range from about 600° C. to about 1800° C., more preferably from about 700° C. to about 1500° C., and most preferably from about 800° C. to about 1200° C. Sintering time may vary depending on the temperature used, and will be apparent to one skilled in the art. The resulting product is a shaped article attaining from about 96 to about 99% of its theoretical maximum density.

This process results in the formation of a heat sink. The heat sinks formed according to this invention may be used in various applications. In one preferred embodiment, an article is formed comprising a microelectronic device and a heat sink attached to the microelectronic device, which heat sink is formed according to the present invention.

The following non-limiting examples serve to illustrate the invention. It will be appreciated that variations in proportions and alternatives in elements of the components of the photosensitive coating composition will be apparent to those skilled in the art and are within the scope of the present invention.

EXAMPLE 1

A molding batch is prepared with copper powder (C112) having a mean particle size of 22 $\mu$m. The batch is made with 7842 g copper powder, 110 g of agar, 50 g of glucose, and 680 g deionized water [DI/H$_2$O]. Also, a mixture of methyl-p-hydroxybenzoate and propyl-p-hydroxybenzoate 1.6 g and 1.2 g respectively is added as biocides. A sigma mixer is used for compounding this batch. The agar, biocides, glucose and water are pre-mixed and transferred to the sigma mixer. During agitation the temperature is raised to 90–95° C. (194–203° F.) and mixed for 30 min. to melt the mixture. The copper powder is added incrementally. The total mixing time is 1.5 h at 90–95° C. (194–203° F). After the material is allowed to cool to 33° C. (91.4° F.), it is shredded into particulates using a food processor (Hobart shredder). The moisture level is adjusted to 94.16 wt % by exposing the material to the atmosphere. Samples are taken periodically and analyzed by using Arizona moisture balance. Spiral testing is conducted by flowing the feedstock material through a hollow spiral mold to evaluate its flow properties, using a Boy 22M injection molding machine. The barrel temperature of the injection molding machine is set at 83° C. (180° F.) and mold temperature kept at 22–23° C. (71.6–73.4° F.) during the molding. At 95.0 wt. % solid the average flow for ten samples at 500, 1000 and 1500 psi (3.5×10$^3$, 6.9×10$^3$, 10.3×10$^3$ KN/m$^2$) injection pressures is evaluated under spiral testing. The flow distance at these injection pressures evaluated to be 3.5"±0.61, 6.3"±0.50 and 10.70"±1.2 (8.9±1.5, 16.0±1.3 and 27.2±3.0 cm) respectively.

EXAMPLE 2

A batch was prepared based on a 1:1 agar to glucose ratio, together with 7842 g of copper powder (C112), 110 g agar, 110 g glucose, 680 g DI/H$_2$O, 1.6 g methyl-p-hydroxybenzoate and 1.2 g propyl-p-hydroxybenzoate. The same mixing procedure is followed as described in Example 1. The solid wt % of the feedstock is adjusted to 95.50 wt % by evaporating the excess water from the material. Spiral testing is conducted on this material at 500, 1000, and 1500 psi (3.5×10$^3$, 6.9×10$^3$, 10.3×10$^3$ KN/m$^2$) injection pressures evaluate the flow characteristics. The flow distances at these pressures measured to be 3.2"±0.30, 5.9"±0.5 and 9.8"±0.9 (8.1±0.8, 14.9±1.5, 24.9±2.3 cm).

EXAMPLE 3

Example 1 is repeated except that the batch is formulated with a agar to glucose ratio of 0.82. An amount of 7842 g of copper powder (C112), 90 g agar, 110 g glucose, 680 g DI/$H_2O$, 1.6 g methyl-p-hydroxybenzoate and 1.2 g propyl-p-hydroxybenzoate are mixed in a sigma mixer. The same mixing procedures and conditions as Example 1 are used. The flow behavior of this batch is evaluated at 95.50 wt % solid and same injection pressures to be 2.1"±0.11, 3.0"±0.15 and 4.5"±0.60 (5.3±0.3, 7.6±0.3, and 11.4±1.5 cm).

EXAMPLE 4

A feedstock composition comprising 7842 g copper powder (C112), 156.8 g agar, 680 g DI/$H_2O$, 1.6 g methyl-p-hydroxybenzoate and 1.2 g propyl-p-hydroxybenzoate is used, with no glucose additives. Same batch mixing procedure as example 1 followed for preparation of this batch. The copper feedstock moisture content of this batch was adjusted to 7 wt % (93.0 wt % solid). The spiral flow characteristic of this batch was evaluated at 500, and 1000 psi ($3.5 \times 10^3$, $6.9 \times 10^3 KN/m^2$) injection pressures. The average flow distance was measured to be 11.3"±0.3 and 24.10"±1.6 (28.7±0.8 and 61.2±4.1 cm).

EXAMPLE 5

Similarly, the preparation of this batch is the same as Example 1. This batch was compounded using 7842 g copper powder (C112), 100 g agar, 180 g glucose, 680 g DI/$H_2O$ (containing 0.27 wt % calcium tetra borate), 1.6 g methyl-p-hydroxybenzoate and 1.4 g propyl-p-hydroxybenzoate. The moisture content of the feedstock is adjusted to 5.46% (94.54 wt % solid) and eleven heat sinks samples were molded using a 55 ton Cincinnati injection molding machine. The average weight of ten as molded samples is 42.66±0.07 g.

EXAMPLE 6

A feedstock sample is made with 7842 g copper powder (C112), 165 g of agar, 1.6 g methyl-p-hydroxybenzoate, 1.2 g propyl-p-hydroxybenzoate (biocides) and 680 g of DI/$H_2O$ containing calcium borate additive. Agar and biocides are mixed with DI/$H_2O$ in a sigma blender at 85–90° C. The pH of the in-situ $H_2O$ is about 10. The copper powder is introduced to the melted binder and mixed for 30–45 min. at 85–90° C. The material is cooled 30–35° C. and shredded. The moisture content of the shredded material is adjusted to 7.38% (92.62 wt % solid). Eleven heat sinks samples were molded using a 55 ton Cincinnati injection molding machine. The samples dried at room temperature and did not develop any distortion or cracks.

What is claimed is:

1. A process for forming a heat sink which comprises:
   a) forming a substantially uniform copper composition comprising:
      i) at least one gel forming polysaccharide binder;
      ii) water; and
      iii) copper particles having an average particle size in the range of from about 2 $\mu$m to about 40 $\mu$m;
   b) molding the copper composition under conditions sufficient to form a solid molded intermediate; and
   c) sintering the solid molded intermediate at a sufficient temperature and for a sufficient time to form a heat sink.

2. A process for forming a heat sink which comprises:
   a) forming a fluid composition comprising:
      i) at least one gel forming polysaccharide binder; and
      ii) water;
   b) heating the fluid composition to melt the binder;
   c) blending copper particles into the fluid composition to thereby form a substantially uniform copper composition;
   d) cooling the copper composition to thereby form a substantially solid copper composition;
   e) shredding the substantially solid copper composition to form a feedstock;
   f) optionally adjusting the moisture content in the feedstock to a level of from about 6% to about 8% moisture by weight of the feedstock;
   g) molding the feedstock under conditions sufficient to form a solid molded intermediate; and
   h) sintering the solid molded intermediate at a sufficient temperature and time to form a heat sink.

3. The process of claim 1 wherein the binder comprises an agaroid.

4. The process of claim 3 wherein said agaroid is agar.

5. The process of claim 1 wherein the copper composition further comprises sugar.

6. The process of claim 5 wherein the sugar is selected from the group consisting of glucose, sucrose, dextrose, fructose, and mixtures thereof.

7. The process of claim 5 wherein said sugar is present in an amount of from about 0.5% to about 6% by weight of the copper composition.

8. The process of claim 5 wherein the weight ratio of the binder to the sugar is from about 0.2 to about 3.5.

9. The process of claim 1 wherein the binder is present in an amount of from about 1.5% to about 10% by weight of the copper composition.

10. The process of claim 1 wherein the copper is present in an amount of from about 50% to about 97% by weight of the copper composition.

11. The process of claim 1 wherein the copper composition further comprises a gel strengthening agent.

12. The process of claim 11 wherein said gel strengthening agent is selected from the group consisting of calcium borate, potassium borate, magnesium borate, zinc borate, and mixtures thereof.

13. The process of claim 1 wherein the copper composition further comprises at least one acid and/or at least one base.

14. The process of claim 1 wherein said copper composition is molded at a temperature of from about 70° C. to about 97° C.

15. The process of claim 1 wherein said copper composition is molded at a temperature of from about 80° C. to about 95° C.

16. The process of claim 1 wherein said molding is conducted in an injection molding device.

17. The process of claim 1 wherein said molded article is sintered at a temperature of from about 600° C. to about 1800° C.

18. A heat sink produced by the process of claim 1.

19. A heat sink produced by the process of claim 2.

20. An article comprising a microelectronic device and a heat sink attached to the microelectronic device, which heat sink is formed by the process of claim 1.

* * * * *